(12) United States Patent
Lee et al.

(10) Patent No.: US 9,905,788 B2
(45) Date of Patent: Feb. 27, 2018

(54) ORGANIC LIGHT EMITTING DISPLAY

(71) Applicant: LG Display Co., Ltd., Seoul (KR)

(72) Inventors: Se-Hee Lee, Paju-si (KR); Sun-Kap Kwon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 20 days.

(21) Appl. No.: 14/087,476

(22) Filed: Nov. 22, 2013

(65) Prior Publication Data

US 2014/0151658 A1    Jun. 5, 2014

(30) Foreign Application Priority Data

Nov. 30, 2012    (KR) .......................... 10-2012-0138330

(51) Int. Cl.
*H01L 51/50* (2006.01)
*H01L 27/32* (2006.01)
*H01L 51/52* (2006.01)

(52) U.S. Cl.
CPC ...... *H01L 51/5012* (2013.01); *H01L 27/3211* (2013.01); *H01L 51/5265* (2013.01)

(58) Field of Classification Search
CPC ............. H01L 51/5012; H01L 27/3211; H01L 51/5265; H01L 27/32
USPC .................... 257/40; 313/504, 506; 315/504; 349/113, 84, 112, 116, 122, 138, 139
See application file for complete search history.

(56) References Cited

U.S. PATENT DOCUMENTS 6,528,188 B1 *  3/2003  Suzuki ............... H01L 51/5036
                                                313/502
2002/0025419 A1   2/2002  Lee et al.
2003/0232194 A1 * 12/2003  Koyanagi ................ D01F 8/14
                                                428/373
2005/0249972 A1 * 11/2005  Hatwar ............... H01L 51/5265
                                                428/690
2006/0055305 A1 *  3/2006  Funahashi .............. C09K 11/06
                                                313/376

(Continued)

FOREIGN PATENT DOCUMENTS

CN        1658718 A       8/2005
CN        102024844       4/2011

OTHER PUBLICATIONS

First Office Action for Chinese Patent Application No. CN 201310629714.4, dated Jan. 22, 2016, 10 Pages.

*Primary Examiner* — Fernando L Toledo
*Assistant Examiner* — Lawrence-Linh T Nguyen
(74) *Attorney, Agent, or Firm* — Fenwick & West LLP

(57) ABSTRACT

An organic light emitting display includes a red light emitting layer, a green light emitting layer and a blue light emitting layer formed between first and second electrodes, a hole-transporting layer formed between the first electrode and each of the red, the green and the blue light emitting layers, and an electron-transporting layer formed between the second electrode and each of the red, the green and the blue light emitting layers, wherein at least one light emitting layer of the red, the green and the blue light emitting layers includes a first light emitting layer including a light emitting host and a light emitting dopant, and a second light emitting layer which is formed between the first light emitting layer and at least one of the electron-transporting layer and the hole-transporting layer, and includes the light emitting dopant.

9 Claims, 7 Drawing Sheets

(56) References Cited

U.S. PATENT DOCUMENTS

2006/0232194 A1* 10/2006 Tung ................ C09K 11/06
313/504
2006/0279203 A1* 12/2006 Forrest .............. H01L 51/0072
313/504

* cited by examiner

ORGANIC LIGHT EMITTING DISPLAY

This application claims the benefit of Korean Patent Application No. 10-2012-0138330, filed on Nov. 30, 2012, which is hereby incorporated by reference as if fully set forth herein.

BACKGROUND OF THE INVENTION

Field of the Invention

The present invention relates to an organic light emitting display with improved viewing angle and lifespan.

Discussion of the Related Art

The recent advent of information-dependent age has brought about rapid development in the display field that visually displays electrical information signals. In this regard, a variety of flat panel displays having superior properties such as slimness, low weight and low power consumption have been developed.

Examples of flat panel displays include liquid crystal displays (LCDs), plasma display panels (PDPs), field emission displays (FEDs), organic light emitting displays (OLEDs), and the like.

In particular, an organic light emitting display spontaneously emits light, which has the advantages of rapid response speed, superior luminous efficacy, excellent brightness and wide viewing angle, as compared to other flat panel displays. Such an organic light emitting display includes an anode and a cathode which face each other such that a light emitting layer is interposed therebetween. Holes injected from the anode recombine with electrons injected from the cathode in the light emitting layer to form electron-hole pairs, i.e., excitons. Upon an exciton's transition to a ground state, energy is released. Based on this energy, the organic light emitting display emits light. The light emitting layer of conventional organic light emitting displays is formed by co-depositing a host with a dopant. However, when a doping concentration is not uniform in the light emitting layer composed of the host and the dopant, an undoped host causes light emission, thus disadvantageously deteriorating viewing angle and lifespan. Specifically, as shown in FIG. 1, in a case in which the viewing angle is zero degrees, when the light emitting layer is uniformly doped, it has one luminescent peak. On the other hand, when the light emitting layer is non-uniformly doped, it has two luminescent peaks. Accordingly, when the light emitting layer is non-uniformly doped, in the case in which the viewing angle is zero degrees, colors corresponding to the two luminescent peaks appear to be mixed and color reliability according to viewing angle is disadvantageously deteriorated.

SUMMARY OF THE INVENTION

Accordingly, the present invention is directed to an organic light emitting display that substantially obviates one or more problems due to limitations and disadvantages of the related art.

An object of the present invention is to provide an organic light emitting display to improve color reliability according to viewing angle and lifespan.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display includes first and second electrodes facing each other on a substrate, a red light emitting layer, a green light emitting layer and a blue light emitting layer formed between the first and second electrodes, a hole-transporting layer formed between each of the red light emitting layer, the green light emitting layer and the blue light emitting layer, and the first electrode, and an electron-transporting layer formed between each of the red light emitting layer, the green light emitting layer and the blue light emitting layer, and the second electrode, wherein at least one light emitting layer of the red light emitting layer, the green light emitting layer and the blue light emitting layer includes a first light emitting layer including a light emitting host and a light emitting dopant, and a second light emitting layer which is formed between at least one of the electron-transporting layer and the hole-transporting layer, and the first light emitting layer, and includes the light emitting dopant.

The second light emitting layer may be formed to have a thickness of 0.5 Å to 10 Å.

The second light emitting layer may be formed of a pure organic substance or a metal complex.

The light emitting dopants of the first and second light emitting layers may include the same phosphorescent or fluorescent dopants, and the light emitting host of the first light emitting layer may include a phosphorescent or fluorescent host.

The red and blue light emitting layers may include the first light emitting layer which includes the light emitting host and the light emitting dopant, and a second light emitting layer which is formed between each of the electron-transporting layer and the hole-transporting layer, and the first light emitting layer, and includes the light emitting dopant, and the green light emitting layer may include the light emitting host and the light emitting dopant.

Each of the red, green and blue light emitting layers may include the first light emitting layer which includes the light emitting host and the light emitting dopant, and the second light emitting layer which is formed between each of the electron-transporting layer and the hole-transporting layer, and the first light emitting layer, and includes the light emitting dopant.

The second electrode may have a monolayer or multilayer structure, each layer may be formed of a metal, an inorganic substance, a mixture of two metals, a mixture of a metal and an inorganic substance, or a combination thereof, a ratio of the metal and the inorganic substance may be 10:1 to 1:10, when each layer is formed of the mixture of the metal and the inorganic substance, a ratio between the two metals may be 10:1 to 1:10, when each layer is formed of the mixture of the two metals, the metal may be Ag, Mg, Yb, Li or Ca, and the inorganic substance may be $LiO_2$, CaO, LiF or $MgF_2$.

The second electrode may have a transmissivity of 30 to 60% in a wavelength range of 430 nm, of 20 to 50% in a wavelength range of 550 nm, and of 15 to 40% in a wavelength range of 650 nm, the second electrode may have a thickness of 100 to 400 Å and a sheet resistance of 40Ω/☐ or less, and the second electrode may have a work function less than 3 to 5.3 eV.

The organic light emitting display may further include a front sealing layer including one or more organic layers and one or more inorganic layers alternately and repeatedly formed on the second electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
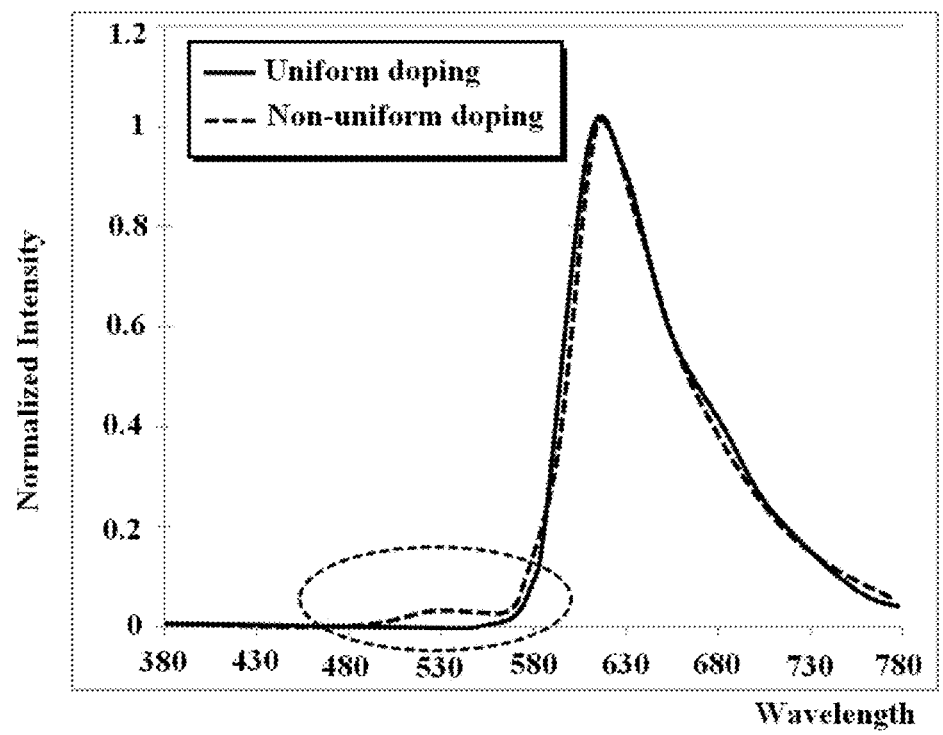
FIG. 1 is a graph showing current density of a conventional organic light emitting display as a function of wavelength.
Figure 2:
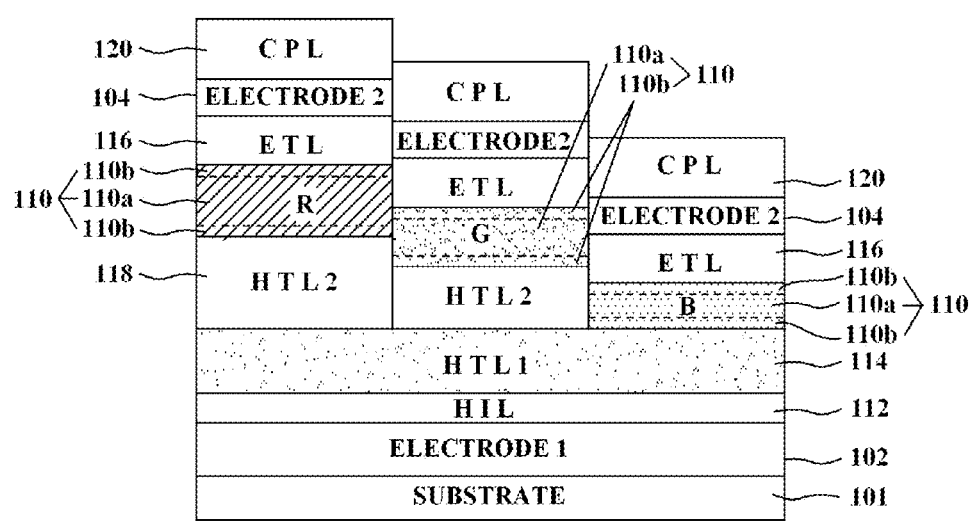
FIG. 2 is a sectional view illustrating an organic light emitting display according to one embodiment of the present invention.

FIG. 2 is a sectional view illustrating an organic light emitting display according to one embodiment of the present invention.

The organic light emitting display shown in FIG. 2 includes red, green and blue light emitting cells formed on a substrate 101.

Each of the red, green and blue light emitting cells further includes a first electrode 102, a hole injection layer 112, a hole-transporting layer 114, a light emitting layer 110, an electron-transporting layer 116, a second electrode 104 and a front sealing layer 120 formed on the substrate 101 in this order. In addition, each of the red and green light emitting cells further includes a second hole-transporting layer 118 formed between the hole-transporting layer 114 and the light emitting layer 110.

At least one of the first and second electrodes 102 and 104 is formed of a transparent electrode. When the first electrode 102 is a transparent electrode and the second electrode 104 is a non-transparent electrode, the organic light emitting display has a rear-surface light emission structure in which light is emitted downward. When the second electrode 104 is a transparent electrode and the first electrode 102 is a non-transparent electrode, the organic light emitting display has a front-surface light emission structure in which light is emitted upward. When both the first and second electrodes 102 and 104 are transparent electrodes, the organic light emitting display has a double-surface light emission structure in which light is emitted upward and downward. In the present invention, an example in which the first electrode 102 is formed of a transparent electrode as an anode and the second electrode 104 is formed of a non-transparent electrode as a cathode will be described.

The first electrode 102 is formed as a transparent electrode using indium tin oxide (hereinafter referred to as ITO), indium zinc oxide (hereinafter referred to as IZO) or the like.

The second electrode 104 has a monolayer or multilayer structure and respective layers constituting the second electrode 104 are formed of a metal, an inorganic substance, a mixture of a metal and a metal, a mixture of a metal and an inorganic substance, or a combination thereof. When each layer is formed of a mixture of a metal and an inorganic substance, a ratio therebetween is 10:1 to 1:10, and when each layer is formed of a mixture of a metal and a metal, a ratio therebetween is 10:1 to 1:10. The metal constituting the second electrode 104 is Ag, Mg, Yb, Li or Ca, and the inorganic substance is formed of $Li_2O$, CaO, LiF or $MgF_2$, aiding electron movement and enabling more electrons to be transported into the light emitting layer 110.

The second electrode 104 has a thickness of 100 to 400 Å, a sheet resistance of 40Ω/□ or less and a work function of less than 3 to 5.3 eV. In addition, the second electrode 104 has a transmissivity of 30 to 60% in a wavelength range of 430 nm, of 20 to 50% in a wavelength range of 550 nm, and of 15 to 40% in a wavelength range of 650 nm.

The hole injection layer 112 supplies holes from the first electrode 102 to the first and second hole-transporting layers 114 and 118. The first and second hole-transporting layers 114 and 118 supply holes from the hole injection layer 112 to the light emitting layer 110 of the respective light emitting cells. The second hole-transporting layer 118 is not formed in the blue light emitting cell and is formed to be thicker in the red light emitting cell than in the green light emitting cell. By controlling the thickness of the second hole-transporting layer 118 in each light emitting cell and inducing constructive interference of emitted light, vertical luminous efficacy in each light emitting cell can be optimized.

The electron-transporting layer 116 supplies electrons from the second electrode 104 to the light emitting layer 110 of each light emitting cell.

In each of the red (R), green (G) and blue (B) light emitting layers 110, holes are supplied through the first and second hole-transporting layers 114 and 118 recombine with electrons supplied through the electron-transporting layer 116, thus causing light emission.

Specifically, each of the red (R), green (G) and blue (B) light emitting layers 110 includes a first light emitting layer 110a and second light emitting layers 110b formed between the first light emitting layer 110a and the hole-transporting layers 114 and 118, and between the first light emitting layer 110a and the electron-transporting layer 116.

Regarding the first light emitting layer 110a, the thickness decreases in an order of the red (R) light emitting layer 110, the green (G) light emitting layer 110 and the blue (B) light emitting layer 110. That is, by controlling the thickness of the second hole-transporting layer 118 in each light emitting cell and inducing constructive interference of emitted light, vertical luminous efficacy in each light emitting cell can be optimized.

The first light emitting layer 110a is formed of a light emitting host of a corresponding color and a light emitting dopant thereof (for example, a pure organic substance or metal complex), and the second light emitting layer 110b is formed of a light emitting dopant which is the same as the first light emitting layer 110a in order to inhibit light emission of the host, based on light emission of the dopant.

For example, the first light emitting layers 110a of the respective red (R) and green (G) light emitting layers 110 are formed of an identical host. That is, the host of the first light emitting layer 110a of the red (R) and green (G) light emitting layers 110 is formed of a phosphorescent host, for example, a Be complex such as $BeBq_2$, CBP, BCP, CDBP, TAZ, mCP or $BAlq_3$, represented by Formula 1 below.

[Formula 1]

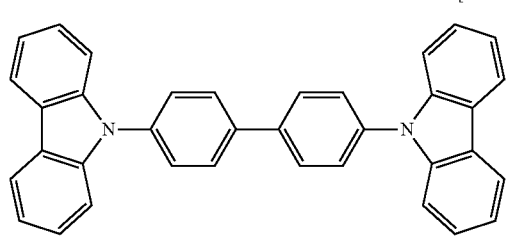

CBP

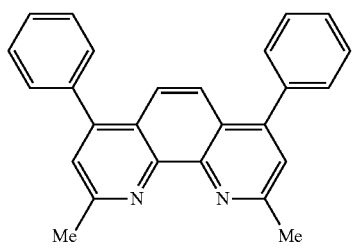

BCP

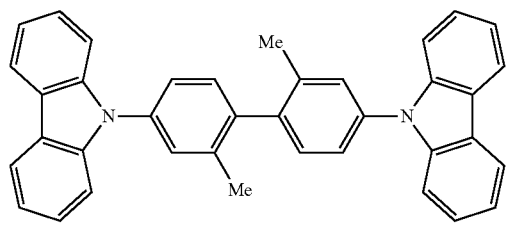

CDBP

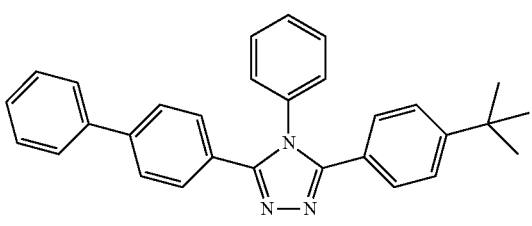

TAZ

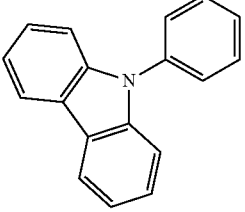

mCP

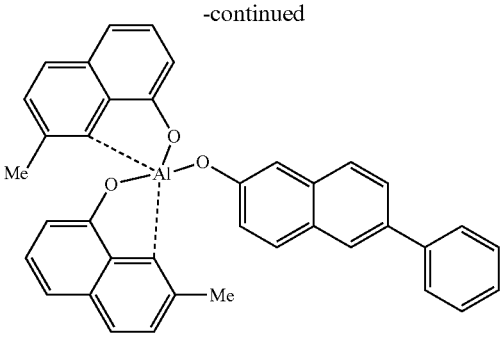

BAlq

The light emitting dopant of the first light emitting layer 110a of the red (R) light emitting layer 110 is formed of an Ir complex-based material represented by Formula 2 as a phosphorescent dopant and the light emitting dopant of the first light emitting layer 110a of the green (G) light emitting layer 110 is formed of an Ir complex-based material represented by Formula 3 as a phosphorescent dopant.

[Formula 2]

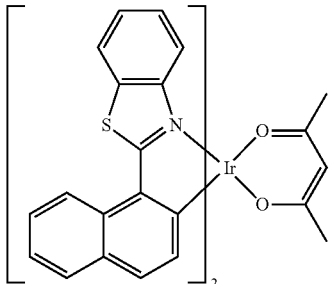

absn$_2$Ir(acac)
(602 nm)

[Formula 3]

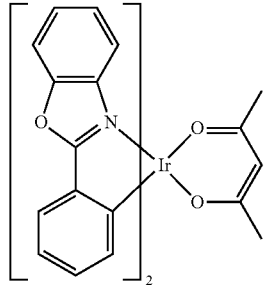

bo$_2$Ir(acac)
(525 nm)

The first light emitting layer 110a of the blue (B) light emitting layer 110 is formed of a light emitting host represented by Formula 4 and a light emitting dopant represented by Formula 5.

[Formula 4]

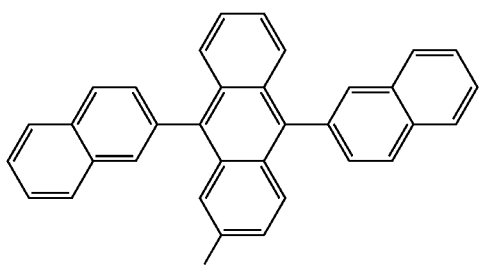

DNA/MADN/TBADN

[Formula 5]

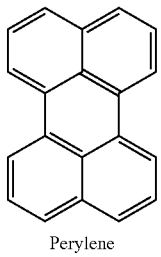
Perylene

The light emitting host and the light emitting dopant contained in the red (R) and green (G) light emitting layers 110 are not limited to the materials represented by the formulas described above, and various derivatives and phosphorescent or fluorescent materials with various structures may be used.

The second light emitting layer 110b of the red (R) light emitting layer 110 is formed to a thickness of about 0.5 Å to about 10 Å using only a red dopant. The second light emitting layer 110b of the red (R) light emitting layer 110 is formed of the same dopant as the first light emitting layer 110a of the red (R) light emitting layer 110.

The second light emitting layer 110b of the green (G) light emitting layer 110 is formed to a thickness of about 0.5 Å to about 10 Å using only a green dopant. The second light emitting layer 110b of the green (G) light emitting layer 110 is formed of the same dopant as the first light emitting layer 110a of the green (G) light emitting layer 110.

The second light emitting layer 110b of the blue (B) light emitting layer 110 is formed to a thickness of about 0.5 Å to about 10 Å using only a blue dopant. The second light emitting layer 110b of the blue (B) light emitting layer 110 is formed of the same dopant as the first light emitting layer 110a of the blue (B) light emitting layer 110.

Figure 3:
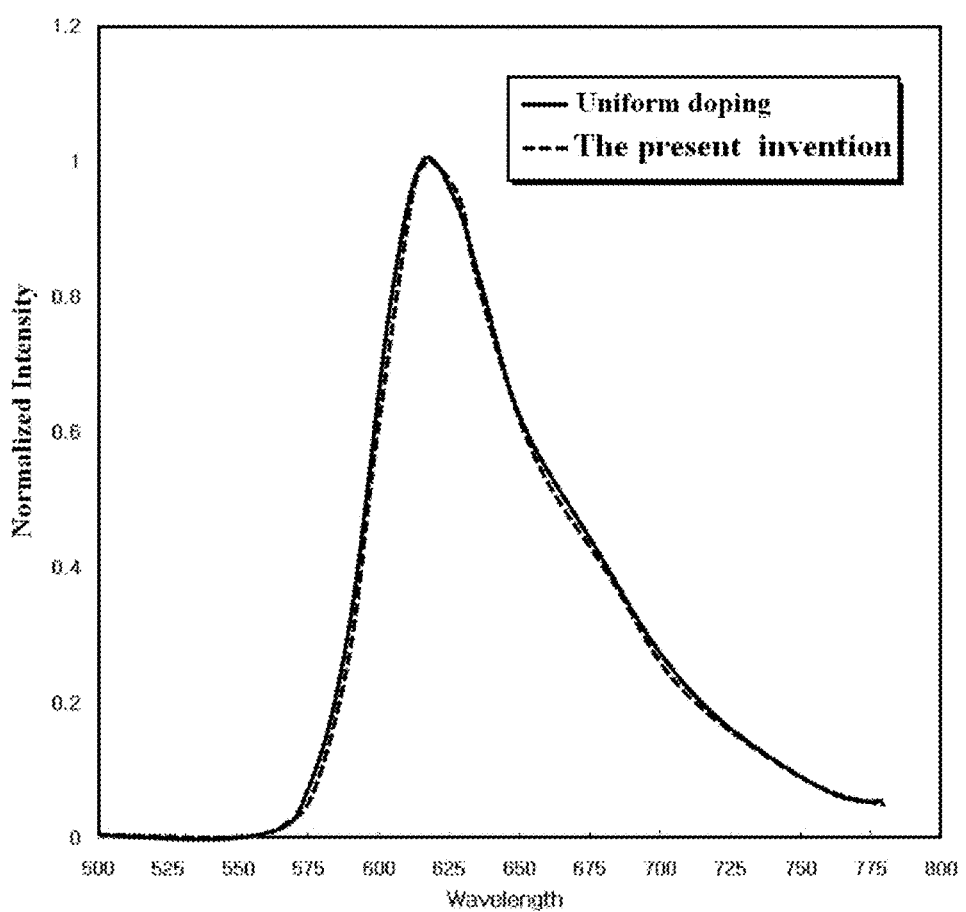
FIG. 3 is a graph showing current density of an organic light emitting display according to one embodiment of the present invention as a function of wavelength.

The second light emitting layer 110b is formed of only a light emitting dopant of a corresponding color and thus serves as an area in which excitons formed by recombination between electrons from the electron-transporting layer 116 and holes from the hole-transporting layers 114 and 118 through HOMO and LUMO levels of respective light emitting dopants are accumulated. The excitons accumulated in the second light emitting layer 110b substantially simultaneously decay, when a density thereof reaches an appropriate level, thus emitting light corresponding to the light emission of the dopant and thereby improve luminous efficacy. That is, as shown in FIG. 3, as in the case in which the red light emitting layer is uniformly doped, when the viewing angle is zero degrees, the red light emitting layer has one luminescent peak and deterioration in color reliability according to viewing angle can be inhibited, and light emission of dopant through the second light emitting layer 110b inhibits light emission of the dopant and thus improves lifespan.

The front sealing layer 120 functions to block permeation of exterior moisture or oxygen and thereby improves reliability. For this purpose, the front sealing layer 120 has a structure including one or more organic layers and one or more inorganic layers repeatedly and alternately formed. The inorganic layer is formed of at least one of aluminum oxide ($Al_xO_x$), silicon oxide ($SiO_x$), $SiN_x$, SiON and LiF in order to primarily block permeation of exterior moisture or oxygen. The organic layer secondarily blocks permeation of exterior moisture or oxygen. In addition, the organic layer functions to offset stress between respective layers generated by bending of the organic light emitting display and reinforce evenness. Such an organic layer is formed of an acryl resin, an epoxy resin, or a polymer such as polyimide or polyethylene.

Figure 4:
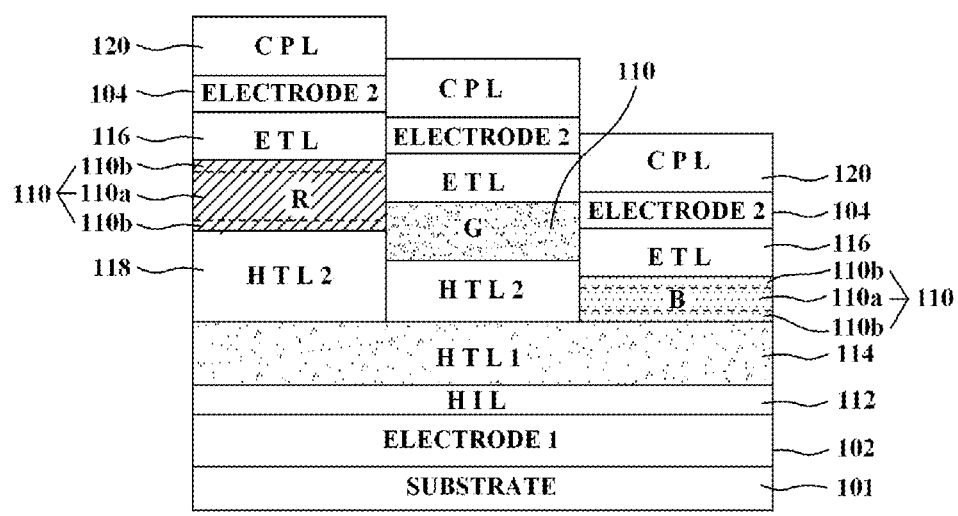
FIG. 4 is a sectional view illustrating an organic light emitting display according to another embodiment of the present invention.

Meanwhile, an example in which each of the red (R), green (G) and blue (B) light emitting layers 110 is formed of the first and second light emitting layers 110a and 110b is described, but as shown in FIG. 4, except the green (G) light emitting layer 110, the red (R) and blue (B) light emitting layers 110 may include the first and second light emitting layers 110a and 110b. That is, since the sensitivity to green realized by the green (G) light emitting layer 110 is lower than those of other colors, green is clearly not seen by the naked eye, although a color shift of green is generated. Accordingly, as shown in FIG. 4, although the green (G) light emitting layer 110 is formed of a monolayer composed of a host and a dopant, and the red (R) and blue (G) light emitting layers 110 are formed as the first and second light emitting layers 110, the same effects as the structure shown in FIG. 2 can be obtained.

In addition, an example in which the second light emitting layer 110b is formed between the electron-transporting layer 116 and the first light emitting layer 110a, and between the hole-transporting layers 114 and 118, and the first light emitting layer 110a has been described, but the second light emitting layer 110b may be formed between the electron-transporting layer 116 and the first light emitting layer 110a, or between the hole-transporting layers 114 and 118, and the first light emitting layer 110a, according to the exciton formation area.

Figure 5A:
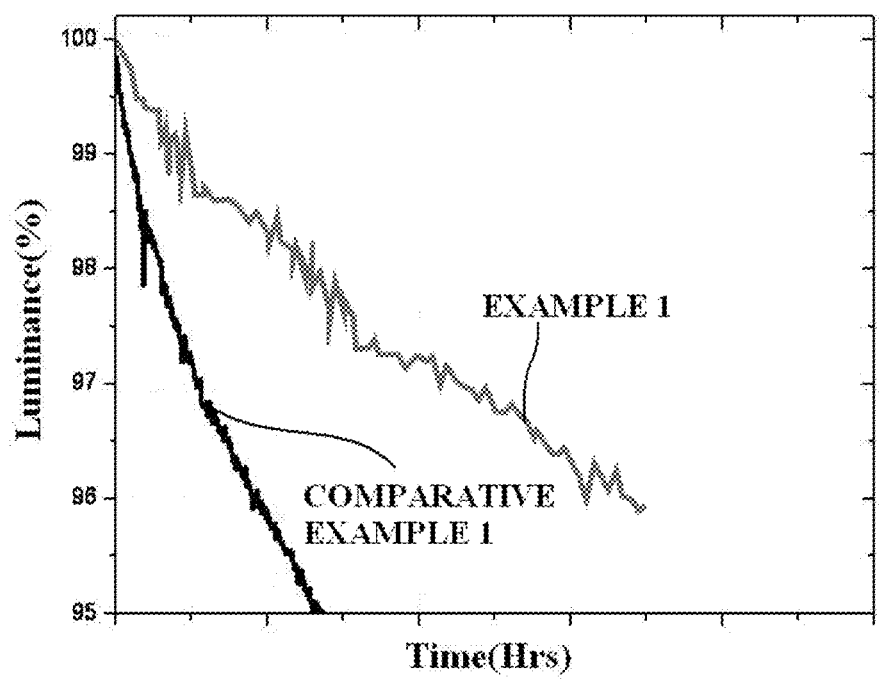
FIGS. 5A and 5B show lifespans of organic light emitting displays according to Examples of the present invention and Comparative Examples.
Figure 5B:
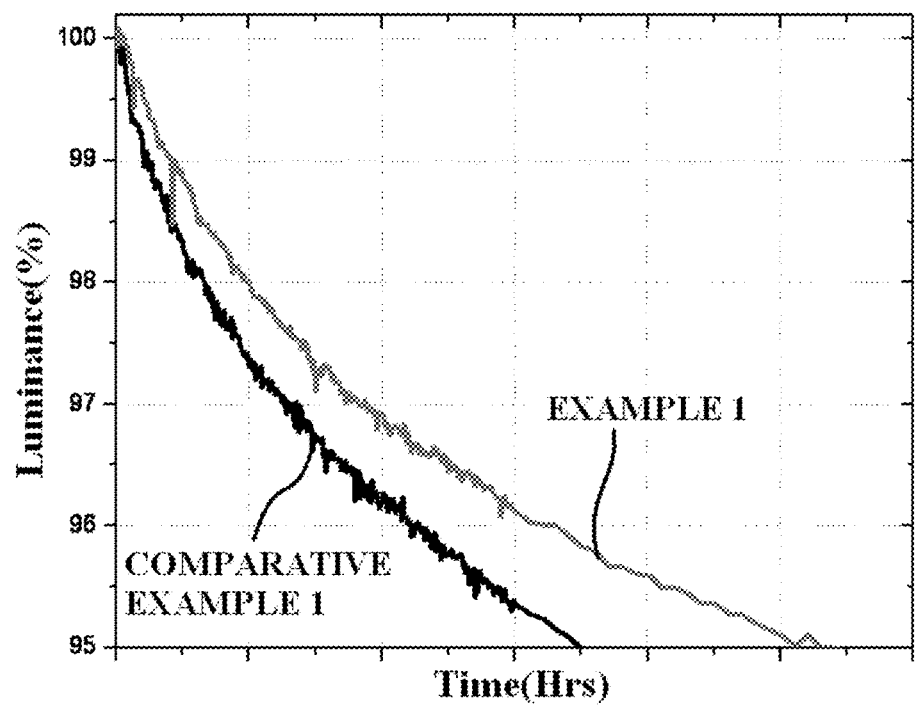

FIGS. 5A and 5B show lifespans of Examples according to the present invention and Comparative Examples.

Comparative Example 1 in FIGS. 5A and 5B has a structure including a red light emitting layer not including a second light emitting layer and being composed of a host and a dopant (substrate/first electrode/hole injection layer/red light emitting layer/electron-transporting layer/electron injection layer/second electrode). Comparative Example 2 has a structure including a blue light emitting layer that does not include a second light emitting layer and being composed of a host and a dopant (substrate/first electrode/hole injection layer/blue light emitting layer/electron-transporting layer/electron injection layer/second electrode). Example 1 has a structure including a red light emitting layer including a first light emitting layer (host+dopant) and second light emitting layers (red dopant composed of an Ir complex having a thickness of 2 to 3 Å) disposed at both sides of the first light emitting layer (substrate/first electrode/hole injection layer/second red light emitting layer/first red light emitting layer/second red light emitting layer/electron-transporting layer/electron injection layer/second electrode). Example 2 has a structure including a blue light emitting layer including a first light emitting layer (host+dopant) and second light emitting layers (blue dopant having a thickness of 1 to 2 Å and being composed of a perylene derivative) disposed at both sides of the first light emitting layer (substrate/first electrode/hole injection layer/second blue light emitting layer/first blue light emitting layer/second blue light emitting layer/electron-transporting layer/electron injection layer/second electrode).

As shown in FIGS. 5A and 5B, Examples 1 and 2 including a second light emitting layer 110b composed of only a dopant between each of the hole-transporting layers 114 and 118, and the electron-transporting layer 116, and the first light emitting layer 110 have improved lifespan, as compared to Comparative Examples 1 and 2 including a light emitting layer in which a host and a dopant are non-uniformly doped.

Figure 6:
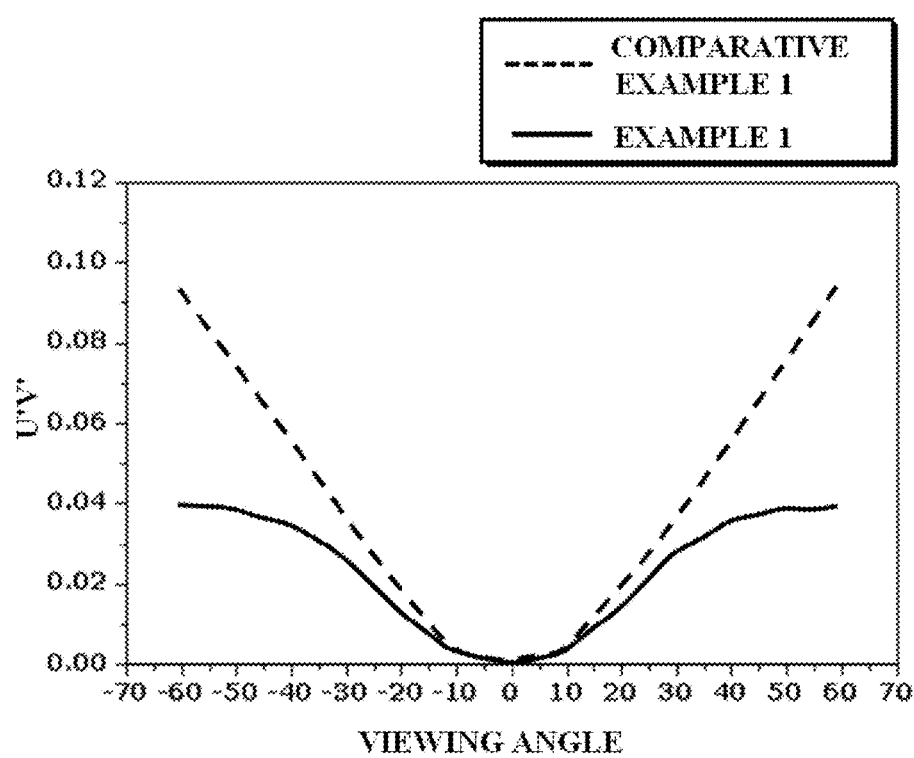
FIG. 6 shows viewing angles of Example 1 according to the present invention and Comparative Example 1.

FIG. 6 shows the output intensity as a function of viewing angle of Example 1 according to the present invention and Comparative Example 1.

FIG. 6 illustrates the output intensity over a range of angles, from 0° (which is seen directly in front of the display) to 15°, 30°, 45° and 60°, which are gradually further inclined. Example 1 exhibits little variation in sensitivity to red in accordance with variation in viewing angle, while Comparative Example 1 exhibits great variation in sensitivity to red in accordance with variation in viewing angle. In addition, Example 1 of the present invention exhibits considerably great improvement in viewing angle, when seen at a viewing angle of 30 degrees or higher, as compared to Comparative Example 1.

The organic light emitting display according to the present invention includes a light emitting layer including a first light emitting layer which includes a light emitting host and a light emitting dopant, and a second light emitting layer which is interposed between each of an electron transporting layer and a hole transporting layer, and the first light emitting layer and includes only a light emitting dopant. As a result, the organic light emitting display can improve color reliability according to viewing angle and lifespan.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
   first and second electrodes facing each other on a substrate;
   a red light emitting layer, a green light emitting layer and a blue light emitting layer formed between the first and second electrodes;
   a hole-transporting layer formed between the first electrode and each of the red light emitting layer, the green light emitting layer and the blue light emitting layer; and
   an electron-transporting layer formed between the second electrode and each of the red light emitting layer, the green light emitting layer and the blue light emitting layer,
   wherein at least one light emitting layer of the red light emitting layer, the green light emitting layer and the blue light emitting layer comprises:
      a first light emitting layer comprising a light emitting host and a light emitting dopant; and
      a second light emitting layer which is formed between the first light emitting layer and at least one of the electron-transporting layer and the hole-transporting layer, the second light emitting layer comprising only the light emitting dopant of the first light emitting layer.

2. The organic light emitting display according to claim 1, wherein the second light emitting layer is formed to have a thickness of 0.5 Å to 10 Å.

3. The organic light emitting display according to claim 1, wherein the second light emitting layer is formed of a pure organic substance or a metal complex.

4. The organic light emitting display according to claim 1, wherein the light emitting dopants of the first and second light emitting layers comprise a same phosphorescent or fluorescent dopant, and the light emitting host of the first light emitting layer comprises a phosphorescent or fluorescent host.

5. The organic light emitting display according to claim 1, wherein the red and blue light emitting layers comprise:
   the first light emitting layer comprising the light emitting host and the light emitting dopant; and
   a second light emitting layer which is formed between each of the electron-transporting layer and the hole-transporting layer, and the first light emitting layer, and comprises the light emitting dopant of the first light emitting layer, and
   the green light emitting layer comprises the light emitting host and the light emitting dopant.

6. The organic light emitting display according to claim 1, wherein each of the red, green and blue light emitting layers comprises:
   the first light emitting layer comprising the light emitting host and the light emitting dopant; and
   the second light emitting layer which is formed between each of the electron-transporting layer and the hole-transporting layer, and the first light emitting layer, and comprises the light emitting dopant of the first light emitting layer.

7. The organic light emitting display according to claim 1, wherein the second electrode has a monolayer or multilayer structure, each layer is formed of a metal, an inorganic substance, a mixture of two metals, a mixture of a metal and an inorganic substance, or a combination thereof,
   a ratio of the metal and the inorganic substance is 10:1 to 1:10, when each layer is formed of the mixture of the metal and the inorganic substance,
   a ratio between the two metals is 10:1 to 1:10, when each layer is formed of the mixture of the two metals, and
   the metal comprises Ag, Mg, Yb, Li or Ca, and the inorganic substance comprises $LiO_2$, CaO, LiF or $MgF_2$.

8. The organic light emitting display according to claim 7, wherein
   the second electrode has a transmissivity of 30 to 60% in a wavelength range of 430 nm, of 20 to 50% in a wavelength range of 550 nm, and of 15 to 40% in a wavelength range of 650 nm,
   the second electrode has a thickness of 100 to 400 Å and a sheet resistance of 40Ω/□ or less, and
   the second electrode has a work function less than 3 to 5.3 eV.

9. The organic light emitting display according to claim 1, further comprising a front sealing layer including one or more organic layers and one or more inorganic layers alternately and repeatedly formed on the second electrode.

* * * * *